United States Patent
Reinmuth et al.

(10) Patent No.: US 10,730,746 B2
(45) Date of Patent: Aug. 4, 2020

(54) METHOD FOR MANUFACTURING A MICROMECHANICAL INERTIAL SENSOR

(71) Applicant: Robert Bosch GmbH, Stuttgart (DE)

(72) Inventors: Jochen Reinmuth, Reutlingen (DE); Martin Rambach, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 259 days.

(21) Appl. No.: 15/963,830

(22) Filed: Apr. 26, 2018

(65) Prior Publication Data
US 2018/0312397 A1  Nov. 1, 2018

(30) Foreign Application Priority Data

Apr. 27, 2017  (DE) .................. 10 2017 207 111

(51) Int. Cl.
| | | |
|---|---|---|
| *B81B 7/02* | (2006.01) | |
| *B81B 5/00* | (2006.01) | |
| *B81C 1/00* | (2006.01) | |
| *B81B 3/00* | (2006.01) | |
| *B81B 7/00* | (2006.01) | |
| *G01P 15/08* | (2006.01) | |

(52) U.S. Cl.
CPC .............. *B81B 7/02* (2013.01); *B81B 3/0005* (2013.01); *B81B 5/00* (2013.01); *B81B 7/0038* (2013.01); *B81C 1/00063* (2013.01); *B81C 1/00277* (2013.01); *B81C 1/00293* (2013.01); *B81B 2201/025* (2013.01); *B81B 2201/0228* (2013.01); *B81B 2201/0235* (2013.01); *B81B 2201/0242* (2013.01); *B81B 2203/0315* (2013.01); *B81C 2201/0143* (2013.01); *B81C 2203/0145* (2013.01); *G01P 2015/088* (2013.01)

(58) Field of Classification Search
CPC ............ B81C 1/00293; B81C 1/00277; B81C 2201/0143; B81C 2203/0145; B81B 7/0038; B81B 3/0005; B81B 2201/0228; B81B 2201/0235; B81B 2201/0242; B81B 2201/025; G01P 2015/088
See application file for complete search history.

(56) References Cited

U.S. PATENT DOCUMENTS

| | | | |
|---|---|---|---|
| 9,567,208 B1 | 2/2017 | Cheng et al. | |
| 2006/0246631 A1* | 11/2006 | Lutz ...................... | B81B 3/0005 438/127 |
| 2012/0032283 A1* | 2/2012 | Frey ...................... | G01L 9/0048 257/415 |
| 2016/0130137 A1* | 5/2016 | Huang ...................... | B81B 7/02 257/415 |

* cited by examiner

*Primary Examiner* — Paul M. West
(74) *Attorney, Agent, or Firm* — Norton Rose Fulbright US LLP; Gerard Messina

(57) ABSTRACT

A method for manufacturing a micromechanical inertial sensor, including: forming a movable MEMS structure in a MEMS wafer; connecting a cap wafer to the MEMS wafer; forming an access opening into the cavity, the access opening to the cavity being formed from two opposing sides; a defined narrow first access opening being formed from one side of the movable MEMS structure and a defined wide second access opening being formed from a surface of the MEMS wafer, the second access opening being formed to be wider in a defined manner than the first access opening; and closing the first access opening while enclosing a defined internal pressure in the cavity.

13 Claims, 5 Drawing Sheets

METHOD FOR MANUFACTURING A MICROMECHANICAL INERTIAL SENSOR

FIELD OF THE INVENTION

The present invention relates to a method for manufacturing a micromechanical inertial sensor. The present invention furthermore relates to a micromechanical inertial sensor.

BACKGROUND INFORMATION

In so-called combination components, i.e., an on-chip integration of multiple sensors (for example, acceleration sensors and rotation rate sensors), in general different pressures are set in various cavities. Very low cavity pressures are used for rotation rate sensors, while in general higher pressures are used in the case of acceleration sensors. The implementation of the different pressures in different cavities may take place with the aid of various technologies, for example, using getter materials, the oxide reseal process, or the laser reseal process.

In the laser reseal process, it is necessary to produce an access opening to the cavity to be closed. This takes place on the cap wafer and not on the sensor wafer.

SUMMARY OF THE INVENTION

It is an object of the present invention to provide an improved method for manufacturing a micromechanical inertial sensor.

The object is achieved according to a first aspect by a method for manufacturing a micromechanical inertial sensor, including the steps:
  forming a movable MEMS structure in a MEMS wafer;
  connecting a cap wafer to the MEMS wafer;
  forming an access opening into the cavity, the access opening to the cavity being formed from two opposing sides;
  a defined narrow first access opening being formed from one side of the movable MEMS structure and a defined wide second access opening being formed from a surface of the MEMS wafer, the second access opening being formed to be wider in a defined manner than the first access opening; and
  closing the first access opening while enclosing a defined internal pressure in the cavity.

In this way, the access opening into the cavity is formed from two opposing sides. A first narrow access channel is created, which, together with a wider access channel created from another side, thereafter creates an access to the cavity. As a result, a lowered closed area is situated below the wafer surface, whereby the closed area may no longer be mechanically stressed. In this way, it is possible to open individual cavities of the inertial sensor and apply a suitable internal pressure thereto, specific requirements for specific sensor types (for example, rotation rate sensor, acceleration sensor, etc.) being met by the selection of the suitable internal pressure.

According to a second aspect, the object is achieved by a micromechanical inertial sensor, including:
  a movable MEMS structure in a MEMS wafer;
  a cap wafer connected to the MEMS wafer;
  a cavity enclosed by the MEMS wafer and by the cap wafer;
  an access opening into the cavity, the access opening to the cavity being formed from two sides;
  a defined narrow first access opening being formed from one side of the movable MEMS structure and a defined wide second access opening being formed from a surface of the MEMS wafer, the second access opening being formed to be wider in a defined manner than the first access opening; and
  the first access opening being closed while enclosing a defined internal pressure in the cavity.

Refinements of the method are the subject matter of the further descriptions herein.

Advantageous refinements of the method provide that the second access opening is produced with the aid of laser drilling and/or with the aid of a trenching method. In this way, different options are advantageously provided for producing the second access opening, laser drilling being advantageous in particular in the processing of polysilicon.

One advantageous refinement of the method provides that the second access opening is not completely formed with the aid of laser drilling, the rest of the second access opening being formed with the aid of a trenching method. Particles that result from the laser drilling thus advantageously cannot enter the movable micromechanical structures and are thus blocked.

Advantageous refinements of the method provide that closing of the first access opening is carried out using a laser reseal process or an oxide reseal process. In this way, different methods for closing the narrow access hole are advantageously provided. In this way, a proven reseal process with local melting of substrate material may be carried out, which provides a good and hermetic closure quality of the access opening in a simple way.

Another advantageous refinement of the method is distinguished in that an anti-adhesion layer material is poured into the cavity during the closing of the first access opening. Depending on the requirement of the sensor type, an anti-adhesion layer material may thus also be inserted to prevent adhesive bonding of the movable structures. Because of the fact that the insertion of the anti-adhesion layer material into the cavity is only carried out after the bonding, an improved quality of the bond frame may thus be provided.

Another advantageous refinement of the method is distinguished in that a ratio of a diameter of the first access opening to a diameter of the second access opening is approximately 1:10. In this way, orders of magnitude of the two access openings are provided, which may be processed well using conventional technologies.

Another advantageous refinement of the method is distinguished in that a diameter of the first access opening is approximately 2 µm to approximately 20 µm, and a diameter of the second access opening is approximately 80 µm to approximately 120 µm. In this way, a ratio between the narrow holes of approximately 1:10 is provided, which may be processed well using conventional technologies.

Another advantageous refinement of the method provides that the MEMS wafer is back-thinned in a defined manner. This advantageously enables sensors to be installed in a smaller package housing. In this way, requirements for geometrical dimensions of the component may be met in a simple way.

The present invention will be described in detail hereafter with further features and advantages on the basis of several figures. Identical or functionally identical elements have identical reference numerals. The figures are intended in particular to illustrate the principles essential to the present invention and are not necessarily true to scale. For the sake of better clarity, it may be provided that all reference numerals may not be plotted in all figures.

Provided method features result similarly from correspondingly provided device features and vice versa. This means in particular that features, technical advantages, and statements relating to the method for manufacturing a micromechanical inertial sensor result similarly from corresponding statements, features, and advantages relating to the micromechanical inertial sensor and vice versa.

DETAILED DESCRIPTION

An important aspect of the present invention is in particular to provide an improved micromechanical inertial sensor, in which after completed bonding of MEMS or sensor wafer and cap wafer, an access into a cavity is created and a suitable internal pressure is enclosed.

Figure 1:
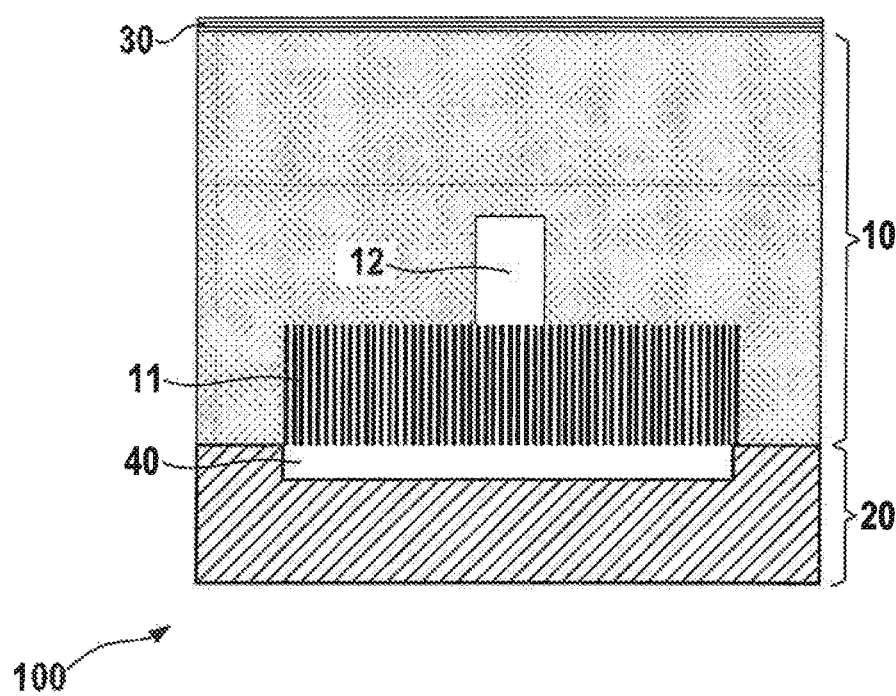
FIG. 1 shows a cross-sectional view of a preliminary stage of a provided micromechanical inertial sensor.

FIG. 1 shows a simplified cross-sectional view of a preliminary stage of a provided micromechanical inertial sensor 100. A MEMS wafer 10 is apparent, on which a final layer 30 in the form of polysilicon and an oxide layer stack is deposited. A movable MEMS structure 11 (only shown schematically), which is provided for a detection of inertial forces, is formed in MEMS wafer 10.

MEMS wafer 10 is closed with the aid of a cap wafer 20, which may be with the aid of a suitable bonding method. Cap wafer 20 may be formed as an ASIC wafer, on which electronic circuits for processing sensor signals of micromechanical inertial sensor 100 are provided. A first access opening 12 in the form of a blind hole is apparent, which is formed in MEMS wafer 10 and has a defined small diameter. A cavity 40 is formed below movable MEMS structure 11.

Figure 2:
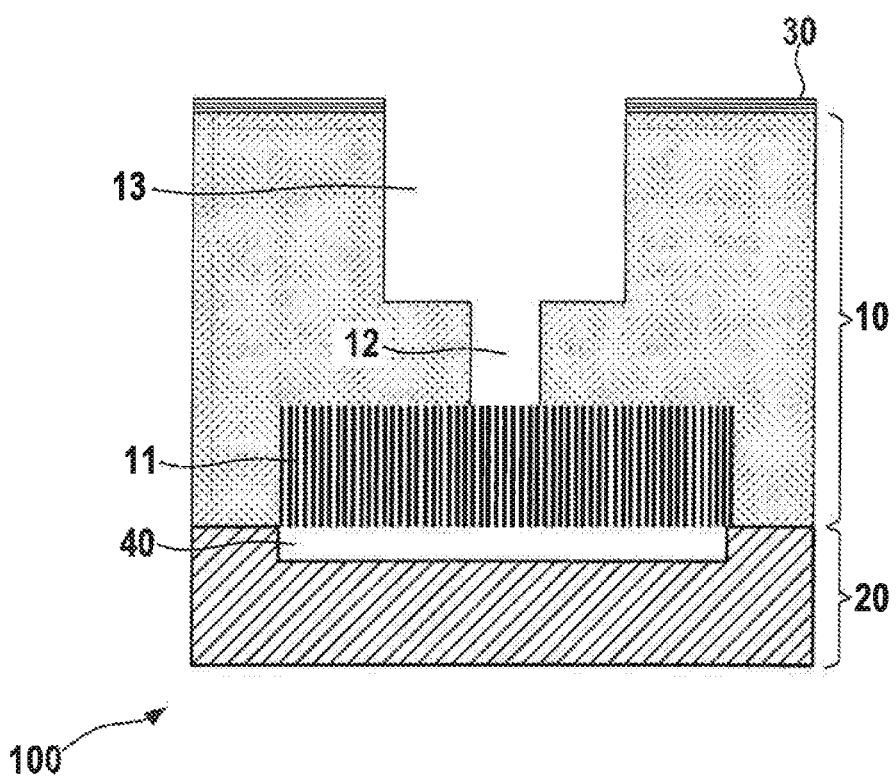
FIG. 2 shows a cross-sectional view of another preliminary stage of a provided micromechanical inertial sensor.

The cross-sectional view of FIG. 2 shows that first access opening 12 was contacted from the surface of MEMS wafer 10 with the aid of a second, larger access opening 13 and a continuous access opening into cavity 40 was thus created.

A suitable closure technology (for example, laser reseal technology or oxide closure technology) may be used to close first access opening 12, different internal pressures may be applied to at least one cavity, advantageously also to multiple cavities for the micromechanical inertial sensor.

As a result, a cavity access formed below the surface of MEMS wafer 10 is provided for micromechanical sensor 100. In this way, the cavity access advantageously does not have to be created in cap wafer 20, which is also not even possible under certain circumstances for processing reasons (destruction of the electronic circuit structures if the cap wafer is configured as an ASIC wafer).

Due to the structure and the further processing of MEMS wafer 10, it is thus provided that the access to cavity 40 be formed not only from one side, but rather from two opposing sides of MEMS wafer 10 (front and rear sides). Access openings 12, 13, which meet inside MEMS wafer 10, create a continuous access into cavity 40 between the MEMS wafer front side and the MEMS wafer rear side in this way.

A "lowered" closure of cavity 40 is thus implemented after the closing of first access opening 12. It is thus advantageously possible to subsequently back-thin MEMS wafer 10, without damaging the closure of cavity 40. This is particularly advantageous, for example, in the case of a MEMS wafer capped using an ASIC wafer, due to the packaging process.

Figure 3:
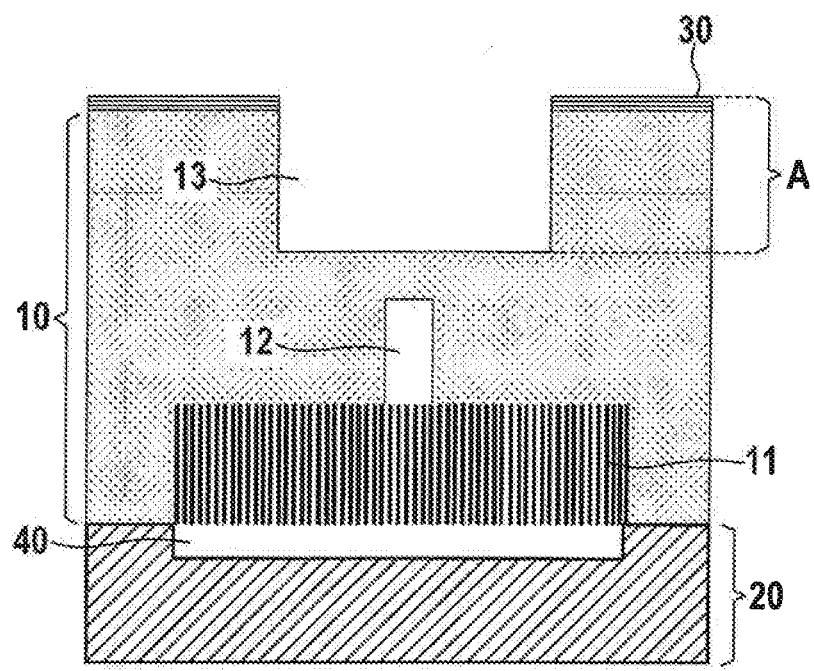
FIG. 3 shows a cross-sectional view of another preliminary stage of a provided micromechanical inertial sensor.

In this way, manufacture of a front and rear side cavity access is provided, which offers the following advantages in particular:

a) simple production of the cavity access from the side of the movable MEMS structures with the aid of a trenching process b) simple production of the cavity access from the side of the surface of the MEMS wafer with the aid of laser drilling and/or a trenching process c) lowering the closure and therefore reducing the thickness of MEMS wafer 10 while simultaneously protecting the closure As indicated in FIG. 3, first access opening 12 is initially created from the side of movable MEMS structure 11 in the manufacturing process. So as not to affect the manufacturing process of movable, sensitive MEMS structure 11, first access opening 12 is advantageously closed using an oxide (not shown), which is removed again using the MEMS exposure process (HF gas phase etching). Very narrow first access openings 12 may thus be formed, which are directly closed. Alternatively, wider first access openings 12 may also be formed, which are closed using the methods described in DE 10 2013 206 328 A1, or are similarly created and closed, as described in DE 10 2009 453 85 A1.

First access opening 12 may have a defined small diameter, since the required depth only has to be a few tens of micrometers, whereby an aspect ratio in the case of trenching is not necessarily limiting.

Figure 4:
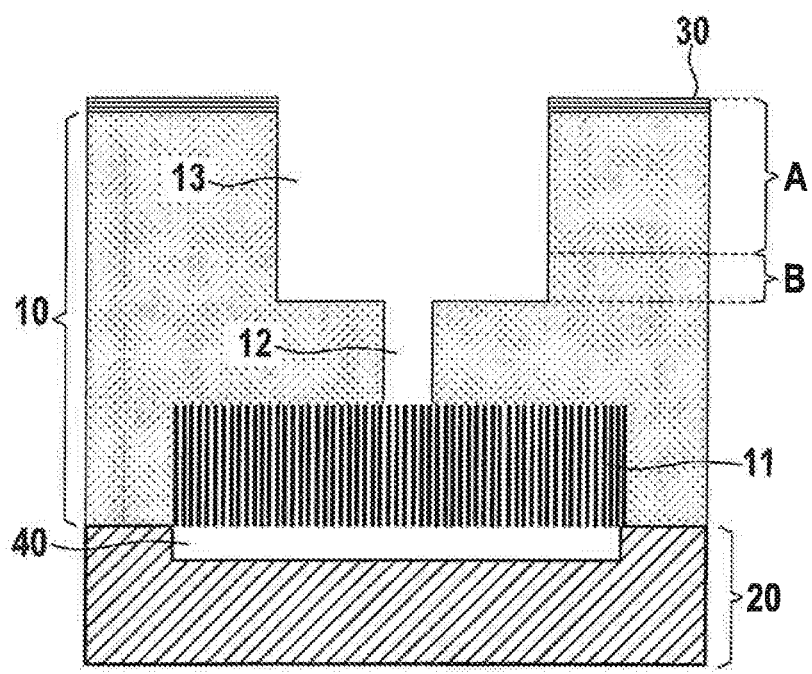
FIG. 4 shows a cross-sectional view of a preliminary stage of a provided micromechanical inertial sensor having an indication of depth dimensions of the second access opening.

FIG. 4 shows that the cavity access on the rear side of MEMS wafer 10 is formed with the aid of second access opening 13, no additional lithography plane being necessary if a laser drilling method is used. One particular advantage is that a drilling depth does not have to be set exactly, but rather the process of laser drilling has a large tolerance window.

This is because a connection solely has to be ensured between the rear side of MEMS wafer 10 and cavity 40 already created on the side of movable MEMS structure 11 using the drilling process. Since first access opening 12 already created on the side of MEMS structure 11 has a certain depth, the laser drilling has to be stopped within first access opening 12, but not at an exactly set depth.

One essential advantage of laser drilling is the processing option of different layers, since a layer stack made up of multiple polysilicon and oxide layers is present on the MEMS wafer rear side at the time of the laser drilling, which only slightly affects the laser drilling process, however. In the case of other methods which are also possible for forming second access opening 13 (for example, trenching), specific process adaptations are required.

During the implementation of second access opening 13 with the aid of laser drilling, it may occur that byproducts or waste products of the laser drilling enter cavity 40 and disadvantageously affect (for example, block) movable MEMS structure 11 therein. This cannot be completely precluded even in the case of an implementation of the cavity access at a certain distance from movable MEMS structure 11.

This may advantageously be avoided by an optionally provided combination of laser drilling and trenching. As shown in FIG. 4, in a first step, deep drilling into the substrate of MEMS wafer 10 into a depth A is carried out with the aid of laser drilling on the rear side of MEMS wafer 10. The laser drilling is stopped before a connection to cavity 40 is established from the MEMS wafer side. In a second step, remaining thickness B of MEMS wafer 10 is removed with the aid of a trenching method, whereby a continuous connection of second access opening 13 to first access opening 12 and thus into cavity 40 is created.

One essential advantage of this "combination approach" is that no lithography is required for this purpose, since, on the one hand, the layer thickness to be trenched is substantially less than the total thickness of MEMS wafer 10 and therefore a removal over the entire area from the rear side of MEMS wafer 10 is not significant. On the other hand, the significantly different etching rates between the MEMS wafer material (silicon) and the oxide layers on the rear side of MEMS wafer 10 may be utilized.

The layer removal on the MEMS wafer rear side is thus also minimized without a lithography mask. A contamination of cavity 40 by byproducts of the laser drilling is advantageously avoided by this combination of laser drilling and trenching.

A schematic view of the two described manufacturing steps of laser drilling and subsequent trenching is schematically shown in FIGS. 3 and 4. It is apparent in FIG. 3 that a continuous access to cavity 40 is not yet established by the laser drilling.

In the second step of the trenching of a layer thickness B of MEMS wafer 10 shown in FIG. 4, a connection between second access opening 13 and already created cavity 40 may be provided via first access opening 12 without an additional mask.

In principle, the formation of second access opening 13 on the rear side of MEMS wafer 10 may also exclusively take place with the aid of a trenching process. This does require a lithography step to define the areas to be etched, since the dimensions of the trench openings are many micrometers in size, however, a cost-effective mask exposure may be used for this purpose.

A total thickness of several hundred micrometers has to be removed, a layer stack made up of multiple layers of polysilicon and oxide layers on the rear side of MEMS wafer 10 having to be etched. The etching through this layer stack takes up considerable processing time, but in this case a combination process with a prior laser drilling is not necessary.

To carry out advantageous lowering of the laser reseal closure, the two access openings 12, 13 are configured having different hole sizes or diameters. Second access opening 13 advantageously has a larger diameter than first access opening 12. The diameter of second access opening 13 is selected on the rear side of MEMS wafer 10 in such a way that the diameter of the laser beam which is used for closing first access opening 12 is significantly smaller.

This thus advantageously enables the laser also to penetrate up to the point of the connection between the two access openings 12, 13 and a closure element 50 being formed intentionally at this point. The diameter of first access opening 12 on the sensor side is selected in such a way that the closure with the aid of a laser is easily possible.

Figure 5:
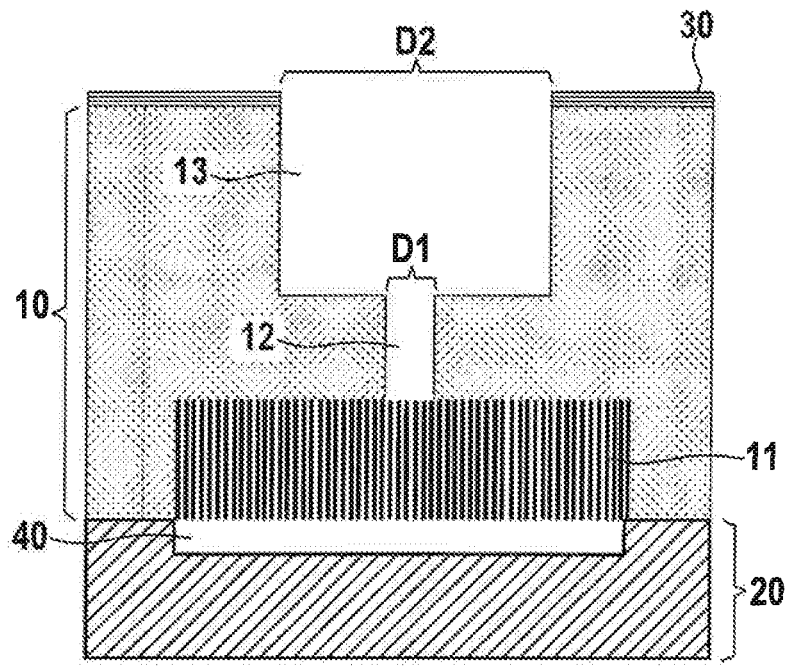
FIG. 5 shows a cross-sectional view of a preliminary stage of a provided micromechanical inertial sensor having an indication of diameter dimensions of the two access openings.

Proportions of the two access openings 12, 13 are schematically indicated in FIG. 5. It is apparent that a diameter D2 of second access opening 13 is substantially larger than a diameter D1 of first access opening 12, a ratio of mentioned diameters D2/D1 being approximately 10/1.

A diameter D2 of second access opening 13 may be approximately 80 μm to approximately 120 μm and a diameter D1 of first access opening 12 may be approximately 2 μm to approximately 10 μm.

Figure 6:
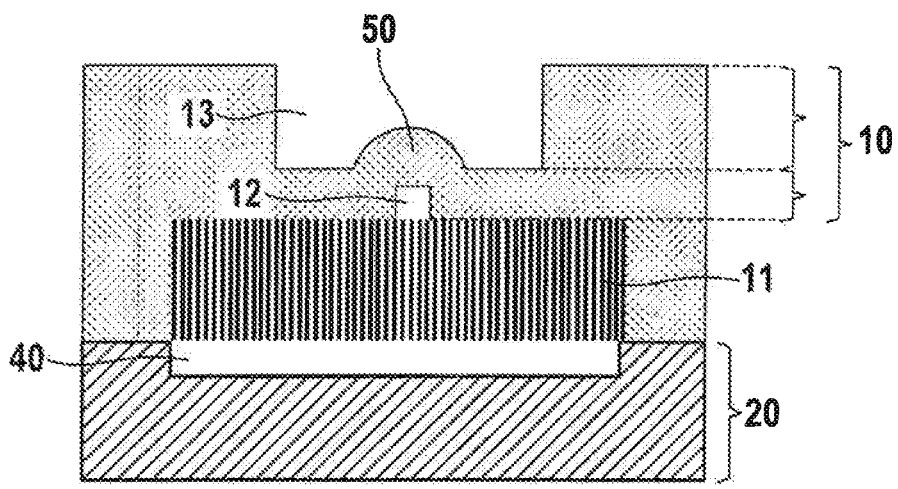
FIG. 6 shows a cross-sectional view of one specific embodiment of a provided micromechanical inertial sensor.

FIG. 6 shows a cross-sectional view of finished micromechanical inertial sensor 100 including first access opening 12 closed using closure element 50. Closure element 50 may be produced with the aid of a laser reseal process step, a defined internal pressure and optionally also an anti-adhesion layer material being enclosed inside cavity 40. The lowering of closure element 50 advantageously enables a total thickness of MEMS wafer 10 to be reduced after the closing (for example, with the aid of laser reseal) by back-thinning. With a lowered closure element 50 of cavity 40, the back-thinning of MEMS wafer 10 may be several hundred micrometers.

In addition, further advantages result from the lowered closure during the further processing of MEMS wafer 10, since in this way, for example, damage due to external forces (for example, suctioning of the wafer rear side onto a wafer chuck) may not directly impact closure element 50.

The closing of first access opening 12 may take place at a high internal pressure for a micromechanical acceleration sensor and at a low internal pressure for a micromechanical rotation rate sensor.

As a result, this thus advantageously enables closed access opening 12 to not be reachable from the surface of MEMS wafer 10, and therefore an undisturbed further processing of micromechanical inertial sensor 100 may advantageously take place.

Figure 7:
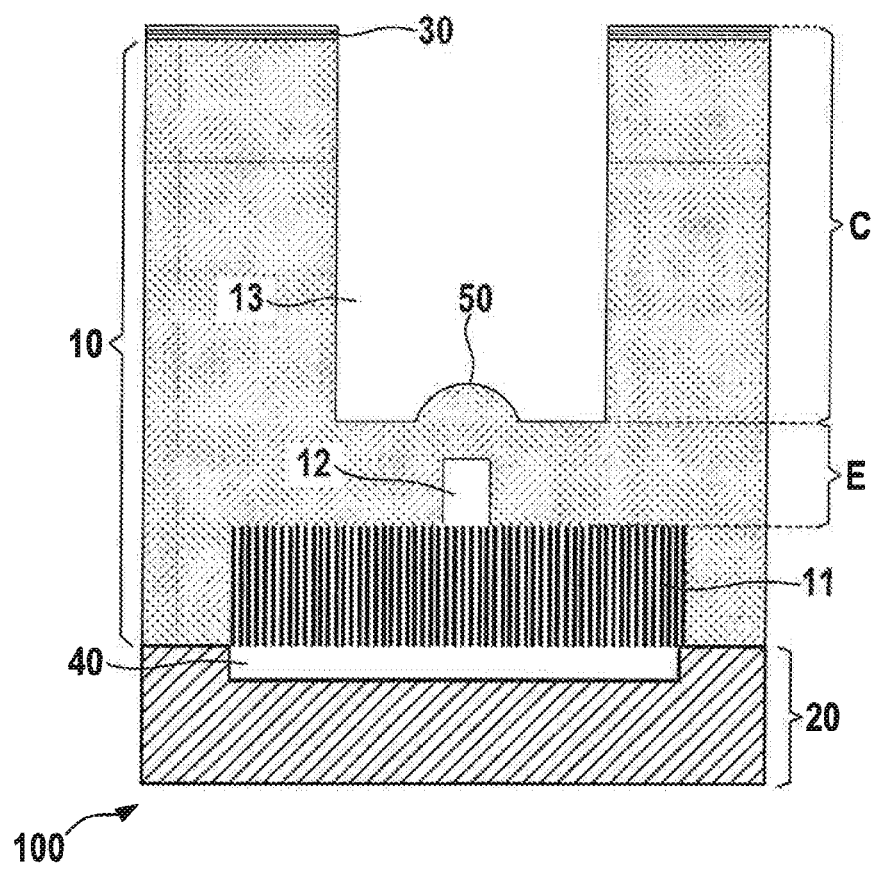
FIGS. 7 and 8 show cross-sectional views of specific embodiments of the provided micromechanical inertial sensor having an indication of proportions of the access openings to the cavity.

FIG. 7 shows schematic size dimensions of one specific embodiment of provided micromechanical inertial sensor 100. A total thickness of MEMS wafer 10 is 725 μm, a depth E of first access opening 12 being approximately 50 μm and a depth C of second access opening 13 being approximately 675 μm.

Figure 8:
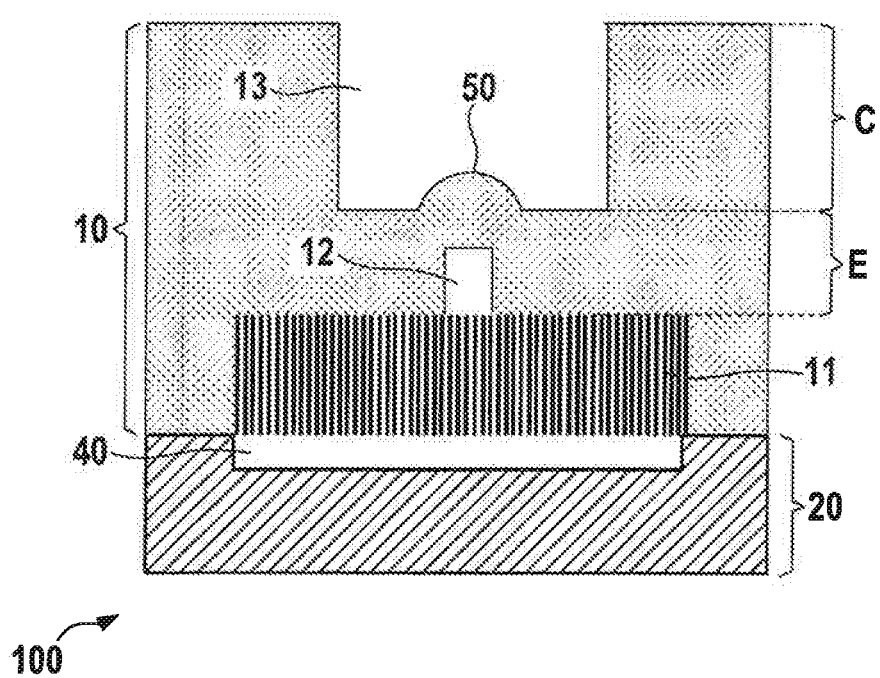

Schematic size dimensions of one specific embodiment of provided micromechanical inertial sensor 100 after the back-thinning of MEMS wafer 10 are indicated in FIG. 8. Depth C of second access opening 13 is approximately 150 μm. Micromechanical inertial sensor 100 is now ground back to a suitable target thickness and thus has suitable geometric dimensions for further processing.

Figure 9:
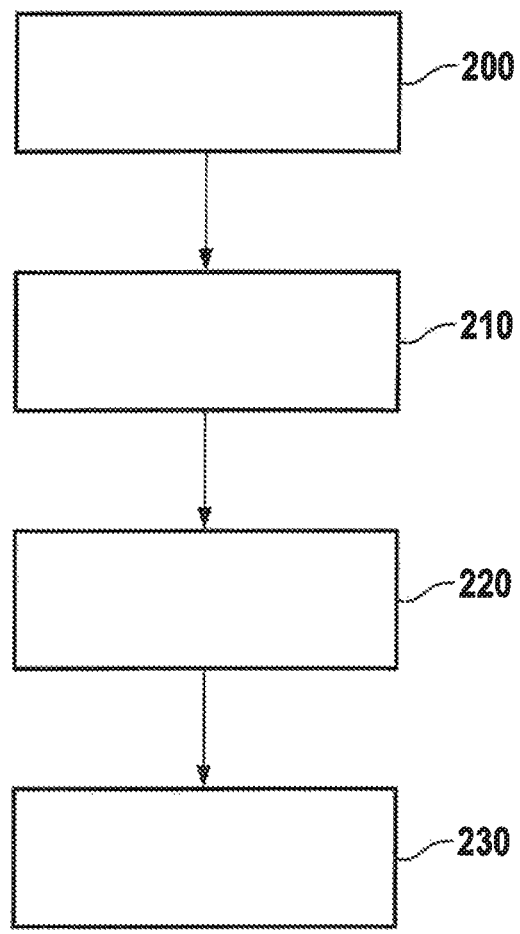
FIG. 9 shows a general sequence of a method for manufacturing a provided micromechanical inertial sensor.

FIG. 9 shows a general sequence of the provided method for manufacturing a micromechanical inertial sensor 100.

In a step 200, a formation of a movable MEMS structure 11 in a MEMS wafer 10 is carried out.

In a step 210, a connection of a cap wafer 20 to MEMS wafer 10 is carried out.

In a step 220, a formation of an access opening 12, 13 into cavity 40 is carried out, access opening 12, 13 to cavity 40 being formed from two opposing sides, a defined narrow first access opening 12 being formed from one side of movable MEMS structure 11 and a defined wide second access opening 13 being formed from a surface of MEMS wafer 10, with second access opening 13 being formed to be wider in a defined manner than first access opening 12.

In a step 230, a closure of first access opening 12 with enclosure of a defined internal pressure in cavity 40 is carried out.

Although the present invention has been described above on the basis of specific exemplary applications, those skilled in the art may also implement specific embodiments which are not described above or are only partially described, without departing from the core of the present invention.

What is claimed is:

1. A method for manufacturing a micromechanical inertial sensor, the method comprising:
    forming a movable MEMS structure in a MEMS wafer;
    connecting a cap wafer to the MEMS wafer;
    forming an access opening into a cavity of the cap wafer, the access opening to the cavity being formed from two opposing sides, wherein a defined narrow first access opening is formed from one side of the movable MEMS structure and a defined wide second access opening is formed from a surface of the MEMS wafer, the second access opening being formed to be wider in a defined manner than the first access opening; and
    closing the first access opening while enclosing a defined internal pressure in the cavity;
    wherein a ratio of a diameter of the first access opening to a diameter of the second access opening is approximately 1:10.

2. The method of claim 1, wherein the second access opening is produced with the aid of laser drilling or with the aid of a trenching process.

3. The method of claim 2, wherein the second access opening is not completely formed with the aid of laser drilling, the rest of the second access opening being formed with the aid of a trenching method.

4. The method of claim 1, wherein closing of the first access opening is carried out using a laser reseal process or an oxide reseal process.

5. The method of claim 4, wherein an anti-adhesion layer material is poured into the cavity during the closing of the first access opening.

6. The method of claim 1, wherein a diameter of the first access opening is approximately 2 µm to approximately 20 µm, and a diameter of the second access opening is approximately 80 µm to approximately 120 µm.

7. The method of claim 1, wherein the MEMS wafer is back-thinned in a defined manner.

8. The method of claim 1, wherein a diameter of the first access opening is approximately 2 µm to approximately 20 µm.

9. The method of claim 1, wherein a diameter of the second access opening is approximately 80 µm to approximately 120 µm.

10. A micromechanical inertial sensor, comprising:
    a movable MEMS structure in a MEMS wafer;
    a cap wafer connected to the MEMS wafer;
    a cavity enclosed by the MEMS wafer and by the cap wafer;
    an access opening into the cavity, the access opening to the cavity being formed from two sides;
    wherein a defined narrow first access is being formed from one side of the movable MEMS structure and a defined wide second access opening is formed from a surface of the MEMS wafer, the second access opening being formed to be wider in a defined manner than the first access opening,
    wherein the first access opening is closed while enclosing a defined internal pressure in the cavity, and
    wherein a ratio of a diameter of the first access opening to a diameter of the second access opening is approximately 1:10.

11. The micromechanical inertial sensor of claim 10, wherein a diameter of the first access opening is approximately 2 µm to approximately 20 µm, and a diameter of the second access opening is approximately 80 µm to approximately 120 µm.

12. The micromechanical inertial sensor of claim 10, wherein a diameter of the first access opening is approximately 2 µm to approximately 20 µm.

13. The micromechanical inertial sensor of claim 10, wherein a diameter of the second access opening is approximately 80 µm to approximately 120 µm.

* * * * *